United States Patent [19]

Nakayama

[11] Patent Number: 4,542,710
[45] Date of Patent: Sep. 24, 1985

[54] SOLUTION-DROPPING NOZZLE DEVICE

[75] Inventor: Muneo Nakayama, Tokyo, Japan

[73] Assignee: Tokyo Denshi Kagaku Co., Ltd., Kanagawa, Japan

[21] Appl. No.: 526,607

[22] Filed: Aug. 26, 1983

[30] Foreign Application Priority Data

Aug. 30, 1982 [JP] Japan .................. 57-151351

[51] Int. Cl.$^4$ ............................. B05C 11/08
[52] U.S. Cl. ..................... 118/52; 118/302; 222/148
[58] Field of Search ............... 118/52, 302; 239/106, 239/112, 120, 121; 222/148

[56] References Cited

U.S. PATENT DOCUMENTS 3,211,377 10/1965 Brenner ................... 239/106 X
4,365,585 12/1982 Naylor et al. ................. 118/302
4,416,213 11/1983 Sakiya .................... 118/52

Primary Examiner—John P. McIntosh
Attorney, Agent, or Firm—Irving M. Weiner; Joseph P. Carrier; John J. Cantarella

[57] ABSTRACT

A solution-dropping nozzle device comprising an inner tube of a relatively large diameter which permits a solution to flow down therethrough, and a plurality of outer tubes of a relatively small diameter adapted for supplying a cleaning solvent to the lower end part of the inner tube, the outer tubes having at least the lower end parts thereof tight-fitted on an outer circumferential portion of the inner tube so as to enclose the same continuously. The outer tubes may have the lower ends thereof positioned higher than the lower end of the inner tube.

The nozzle device is free from the concentration of a dropping solution at the nozzle end part, and the eduction of a solute thereof.

11 Claims, 4 Drawing Figures

SOLUTION-DROPPING NOZZLE DEVICE

BACKGROUND OF THE INVENTION

1. Field of the Invention

The present invention relates generally to a solution-dropping nozzle device. More particularly, the invention relates to a solution-dropping nozzle device for thin-film coating treatments.

2. Description of Relevant Art

A variety of nozzle devices are widely employed for dropping a liquid such as a coating liquid containing a diffusion agent or a coating liquid for the formation of a metal oxide film or a photoresist on an object to be treated. For example, to coat a diffusion agent for semi-conductors on a wafer in a production process such as for an IC or an LSI, with reference to FIG. 4 of the accompanying drawings, a wafer 51 is mounted on a spinner 50 and, while or after dropping a coating liquid containing a diffusion agent from a nozzle 52 onto the surface of the central part of the wafer 51, is spun thereby at a high speed so as to provide a uniform coating of the diffusion agent on the surface of the wafer 51 by virtue of the centrifugal force.

After dropping the coating liquid from the nozzle 52, a small amount of the coating liquid still remains on a peripheral portion 52a at the tip of the nozzle 52 due to, for example, the surface tension. With the lapse of time, the remaining coating liquid on the peripheral portion 52a, which is generally a solution consisting of a diffusion agent dissolved in a solvent such as an organic solvent, will have only its solvent evaporate, thus being gradually concentrated to finally have its solute, i.e., the diffusion agent, educed.

The coating liquid as thus concentrated may fall on the wafer, rendering the coating uneven and causing the production of sub-standard goods, with a considerable disadvantage to productivity.

Conventionally, in order to avoid such disadvantage, the fall of such concentrated liquid has been prevented by wiping the nozzle tip with a sponge, a cloth or a filter paper, for example, which may selectively be impregnated with a solvent. However, such conventional method must rely upon manual operations, thus causing problems with respect to mass production. Moreover, if the spacing between a nozzle and a spinner is relatively narrow, the wiping work is difficult, and foreign material may fall on the wafer surface. Furthermore, such conventional method generally prevents a coating step and preceding and subsequent steps thereof from being performed by a series of continuous operations, thus further impeding full automation of the production process.

The present invention effectively overcomes the foregoing problems and disadvantages attendant conventional techniques.

SUMMARY OF THE INVENTION

The present invention provides a solution-dropping nozzle device comprising an inner tube of a relatively large diameter which permits a solution to flow down therethrough, and a plurality of outer tubes of a relatively small diameter adapted for supplying a cleaning solvent to the lower end part of the inner tube, the outer tubes having at least the lower end parts thereof tight-fitted on an outer circumferential portion of the inner tube so as to enclose the same continuously.

An object of the present invention is to provide a solution-dropping nozzle device which is free from the concentration of a dropping solution at the lower end part of a nozzle, eduction of a solute thereof, and other similar problems.

The above and further objects, features and advantages of the present invention will become apparent from the following detailed description of preferred embodiments of the invention, when read in conjunction with the accompanying drawings.

DETAILED DESCRIPTION OF PREFERRED EMBODIMENTS

Figure 1:
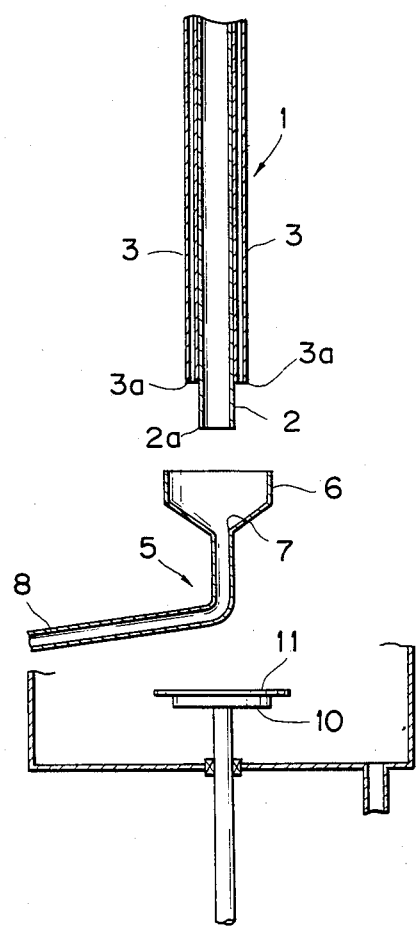
FIG. 1 is a schematic illustration showing a solution-dropping nozzle device according to a first embodiment of the invention, as applied to a typical thin-film coating apparatus.

Referring first to FIG. 1, the solution-dropping nozzle device according to the first embodiment of the invention has a nozzle 1 for dropping a coating solution of a diffusion agent on, for example, a wafer 11 placed on a spinner 10. The nozzle 1 comprises an inner tube 2 of a relatively large inner diameter which permits the coating solution to flow down therethrough, and a plurality of outer tubes 3 of a relatively small inner diameter adapted for supplying an organic solvent as a cleaning solvent of the coating solution. The outer tubes 3 are tight-fitted or fixed onto an outer circumferential portion of the inner tube 2 so as to enclose the same continuously or with no space left between any adjacent two of the outer tubes 3. The outer tubes 3 have their lower end parts 3a positioned above the lower end of the inner tube 2.

The nozzle 1 is disposed substantially above the center of the wafer 11 placed on the spinner 10, while being spaced therefrom by a predetermined distance. The coating solution is to be dropped from the lower end of the inner tube 2 before or while rotating the spinner 10 so as to have the dropped coating solution spread to be evenly applied with the centrifugal force over the surface of the wafer 11. After the dropping step, a small amount of the coating solution invariably remains on a peripheral portion 2a of the lower end part of the inner tube 2 due to the surface tension and the like. This remaining liquid may be concentrated with the vaporization of a solvent thereof or have the diffusion agent thereof educed as a solid matter, thus requiring removal. To this end, the outer tubes 3 are arranged on an outer circumferential portion of the inner tube 2 in order to supply a suitable solvent to the peripheral portion 2a of the lower end part of the inner tube 2, dissolving to wash away therefrom the remaining liquid as concentrated or the educt, thereby favorably cleaning the peripheral portion 2a.

In this connection, in order to avoid an undesirable dropping of the solvent or cleaning liquid onto the spinner 10 during cleaning, a draining device 5 is provided so as to be insertable under the nozzle 1 as shown in FIG. 1. The draining device 5, which comprises a funnel-like receiver 6 having a diameter sufficiently larger than the total diameter of the nozzle 1, and a drain pipe 8 communicating with an opening 7 formed through a bottom of the receiver 6, is placed just under the nozzle 1 for the cleaning step and removed aside therefrom for the dropping step.

Figure 2:
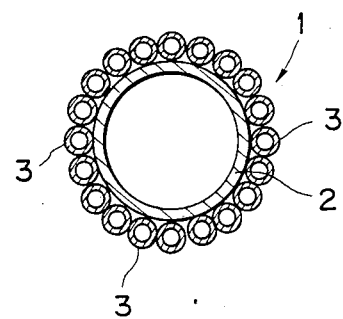
FIG. 2 is a cross-sectional view of the solution-dropping nozzle device of FIG. 1.

Referring now to FIG. 2, on an outer circumferential portion of the relatively larger inner tube 2 are tight-fitted the relatively small outer tubes 3 so as to enclose the inner tube 2 without spacing apart any adjacent outer tubes 3 from each other.

Figure 3:
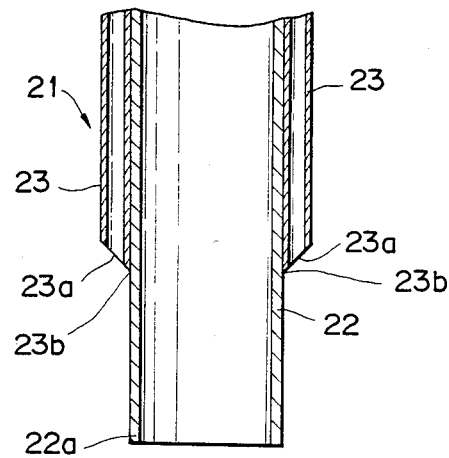
FIG. 3 is a longitudinal sectional view of an essential part of a solution-dropping nozzle device according to a second embodiment of the invention.

Referring now to FIG. 3, generally designated by reference numeral 21 is a nozzle. The nozzle 21 comprises an inner tube 22 having a relatively large diameter and a plurality of outer tubes 23 having a relatively small diameter, the outer tubes 23 being tight-fitted on an outer circumferential portion of the inner tube 22 so as to enclose the same with no space left between the outer tubes 23. The outer tubes 23 have their lower end parts 23a cut obliquely. Each lower end part 23a is tight-fitted at its lowest edge 23b on the outer circumference of the inner tube 22, to thereby permit a cleaning solvent which has flowed down through the outer tube 23 to easily come down along the outer circumference of the inner tube 22 to a lower end portion 22a thereof.

In the above-described embodiments of the invention, in which a plurality of outer tubes of a relatively small diameter are tight-fitted on an outer circumferential portion of an inner tube of a relatively large diameter so as to enclose the same with no space left between the outer tubes, it will be apparent with respect to each outer tube that no more than or at least the lower end part thereof is essentially required to be tight-fitted on an outer circumferential portion of the inner tube so as to effect the enclosure without space to accomplish the object of the invention.

The present invention will hereinafter be described in conjunction with two experimental examples.

EXAMPLE 1

A thin-film coating apparatus was constructed as shown in FIG. 1 using a nozzle comprising an inner tube with a diameter of 1.5 mm and outer tubes with a diameter of 0.3 mm, the inner tube projecting downwardly by 5 mm from the lower end of the outer tubes.

The inner tube of the nozzle was then supplied with a coating liquid called "OCD" (trade name of a silica-film coating liquid of a concentration of 5.9 percent weight in terms of $SiO_2$, a product of Tokyo Ohka Kogyo Co., Ltd.), and an ethyl alcohol was prepared for supply from the outer tubes. At first, from the inner tube, 1 ml of "OCD" was dropped on a wafer. Then, after placing a funnel-like receiver of a draining device under the nozzle, 3 ml of the ethyl alcohol was supplied from the outer tubes to wash the lower end part of the inner tube.

As a result, even after a lapse of 30 minutes from the cleaning, no eduction of solid matter nor concentration of the dropped liquid was found at the lower end part of the inner tube.

Moreover, after the operation was repeated many times, the results remained as favorable as the foregoing result.

EXAMPLE 2

Figure 4:
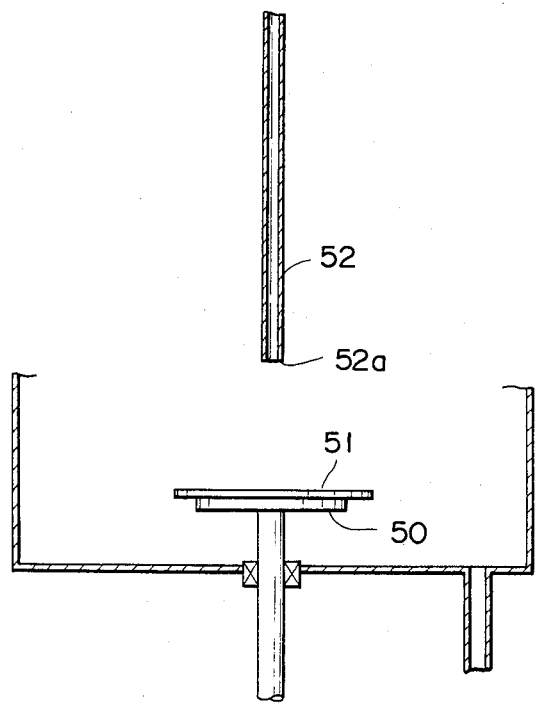
FIG. 4 is a schematic illustration showing a conventional solution-dropping nozzle device as applied to a typical thin-film coating apparatus.

In order to compare between the effects of the foregoing Example 1 and a conventional technique, a conventional apparatus similar to that shown in FIG. 4 was prepared, using a conventional nozzle with a diameter of 1.5 mm, and the same liquid as employed in Example 1 was dropped, with the result that, at about 2 minutes after the dropping, an eduction of a white solute was found at the lower end part of the nozzle.

In the foregoing embodiments of the invention, the provision of a draining device is not always essential. In a modified embodiment there may be provided no draining device, and a nozzle and a rotating device provided with a spinner are either or both movable sideways so that, in the cleaning step, no cleaning liquid drops on the spinner.

Moreover, the present invention, which has been described hereinabove with respect to the application of dropping a coating solution of a diffusion agent for the production of semiconductors, is not restricted or limited thereto but is widely applicable to the dropping of a solution using a highly volatile solvent.

As will be understood from the foregoing description, the present invention provides a solution-dropping nozzle device comprising an inner tube of a relatively large diameter which permits a solution to flow down therethrough, and a plurality of outer tubes of a relatively small diameter adapted for supplying a cleaning solvent to the lower end part of the inner tube, the outer tubes having a least the lower end parts thereof tight-fitted on an outer circumferential portion of the inner tube so as to enclose the same continuously, while the lower end of each outer tube may be positioned to be higher than that of the inner tube. Such structure achieves a number of advantages such as that no concentration of a solution or eduction of a solute is found at the lower end part of the nozzle, thus preventing irregularity of the coating and the like, and manual wiping becomes unnecessary, enabling the coating process and preceding and subsequent processes to be put under fully-automatic control. Further, there is provided a useful and inexpensive nozzle device which is simple in structure and facilitates production.

Although there have been described what are at present considered to be the preferred embodiments of the invention, it will be understood that the present invention may be embodied in other specific forms without departing from the spirit or essential characteristics thereof. The present embodiments are therefore to be considered in all respects as illustrative and not restrictive. The scope of the invention is indicated by the appended claims rather than by the foregoing description.

I claim:

1. A solution-dropping nozzle device, comprising:
    an inner tube of a relatively large constant diameter which permits a solution to flow down therethrough;
    a plurality of outer tubes of a relatively small diameter adapted to supply a cleaning solvent to a lower end part of said inner tube;
    said outer tubes having at least lower end parts thereof tight-fitted on an outer circumferential portion of said inner tube so as to enclose the same substantially continuously; and
    said outer tubes having the lower ends thereof positioned higher than the lower end of said inner tube.
2. A nozzle device according to claim 1 wherein:
    said lower ends of said outer tubes are all at substantially the same level.

3. A nozzle device according to claim 2, further comprising:
   a draining mechanism disposed substantially proximal to said lower end of said inner tube so as to receive and drain said cleaning solvent.

4. A nozzle device according to claim 1, further comprising:
   a draining mechanism disposed substantially proximal to said lower end of said inner tube so as to receive and drain said cleaning solvent.

5. A solution dropping nozzle device according to claim 1, wherein:
   said plurality of outer tubes are adapted to each simultaneously supply said cleaning solvent to said lower end part of said inner tube such that the entire periphery of said lower end part of said inner tube is supplied with solvent.

6. A solution-dropping nozzle device, comprising:
   an inner tube of a relatively large diameter which permits a solution to flow down therethrough;
   a plurality of outer tubes of a relatively small diameter adapted to supply a cleaning solvent to a lower end part of said inner tube;
   said outer tubes having at least lower end parts thereof tight-fitted on an outer circumferential portion of said inner tube so as to enclose the same substantially continuously;
   said outer tubes having the lower ends thereof positioned higher than the lower end of said inner tube;
   said lower ends of said outer tubes all being at substantially the same level; and
   said lower end parts of said outer tubes being cut obliquely and having the lowest edges thereof tight-fitted on said lower end part of said inner tube.

7. A nozzle device according to claim 6, further comprising:
   a draining mechanism disposed substantially proximal to a lower end of said inner tube so as to receive and drain said cleaning solvent.

8. A solution-dropping nozzle device in a thin-film coating apparatus including a spinner, comprising:
   an inner tube of a relatively large constant diameter which permits a solution to flow down therethrough;
   a plurality of outer tubes of a relatively small diameter adapted to supply a cleaning solvent to a lower end part of said inner tube;
   said outer tubes having at least lower end parts thereof tight-fitted on an outer circumferential portion of said inner tube so as to enclose the same substantially continuously; and
   said outer tubes having the lower ends thereof positioned higher than the lower end of said inner tube.

9. A solution-dropping nozzle device according to claim 8, wherein:
   said lower ends of said outer tubes are all at substantially the same level.

10. A solution-dropping nozzle device according to claim 8, wherein:
    said lower end parts of said outer tubes are cut obliquely and have the lowest edges thereof tight-fitted on said lower end part of said inner tube.

11. A solution-dropping nozzle device according to claim 8, further comprising:
    a draining mechanism disposed substantially proximal to said lower end of said inner tube so as receive and drain said cleaning solvent.

* * * * *